United States Patent [19]
Gall et al.

[11] Patent Number: 5,403,420
[45] Date of Patent: Apr. 4, 1995

[54] FABRICATION TOOL AND METHOD FOR PARALLEL PROCESSOR STRUCTURE AND PACKAGE

[75] Inventors: Thomas P. Gall, Endwell; James R. Loomis, Binghamton; David B. Stone, Owego; Cheryl L. Tytran; James Wilcox, both of Vestal, all of N.Y.

[73] Assignee: International Business Machines Corporation, Armonk, N.Y.

[21] Appl. No.: 97,603

[22] Filed: Jul. 27, 1993

[51] Int. Cl.$^6$ ............................................. B32B 31/00
[52] U.S. Cl. ..................................... 156/182; 29/622; 156/289; 156/323; 200/237; 200/278; 200/292; 395/800
[58] Field of Search ....................... 156/182, 289, 323; 200/237, 278, 292; 29/622; 395/800

[56] References Cited

U.S. PATENT DOCUMENTS 2,444,026  6/1948  Bartelheim et al. ................. 156/182

FOREIGN PATENT DOCUMENTS

61-83998  8/1986  Japan ..................... 156/289

*Primary Examiner*—John J. Gallagher
*Attorney, Agent, or Firm*—Richard M. Goldman

[57] ABSTRACT

Disclosed is a parallel processor packaging structure and a method for manufacturing the structure. The individual logic and memory elements are on printed circuit cards. These printed circuit boards and cards are, in turn, mounted on or connected to circuitized flexible substrates extending outwardly from a laminate of the circuitized, flexible substrates. Intercommunication is provided through a switch structure that is implemented in the laminate. The printed circuit cards are mounted on or connected to a plurality of circuitized flexible substrates, with one printed circuit card at each end of the circuitized flexible circuit. The circuitized flexible substrates connect the separate printed circuit boards and cards through the central laminate portion. This laminate portion provides XY plane and Z-axis interconnection for inter-processor, inter-memory, inter-processor/memory element, and processor to memory bussing interconnection, and communication. The planar circuitization, as data lines, address lines, and control lines of a logic chip or a memory chip are on the individual printed circuit boards and cards, which are connected through the circuitized flex, and communicate with other layers of flex through Z-axis circuitization (vias and through holes) in the laminate.

9 Claims, 5 Drawing Sheets

FABRICATION TOOL AND METHOD FOR PARALLEL PROCESSOR STRUCTURE AND PACKAGE

CROSS REFERENCE TO RELATED APPLICATIONS

This application is related to the following co-pending, commonly assigned United States Patent Applications:

U.S. patent application Ser. No. 07/097,544, filed Jul. 27, 1993, by Charles Davis, Thomas, Duffy, Steven Hankovic, Howard Heck, John Kolias, and John Kresge, David Light, and Ajit Trevidi for Method of Fabricating A Flex Laminate Package.

U.S. patent application Ser. No. 09/096,744, filed Jul. 27, 1993, by Raymond T. Galasco and Jayanal T. Molla for Solder Bonded Parallel Processor Package Structure and Method of Solder Bonding.

U.S. patent application Ser. No. 08/097,810, filed Jul. 27, 1993, by Thomas Gall and James Wilcox for Method and Apparatus for Electrodeposition.

U.S. patent application Ser. No. 08/098,085, filed Jul. 27, 1993, by Robert D. Edwards, Frank D. Egitto, Thomas P. Gall, Paul S. Gursky, David E. Houser, James S. Kamperman, and Warren R. Wrenner for Method of Drilling Vias and Through Holes.

U.S. patent application Ser. No. 08/097,606, filed Jul. 27, 1993, by John H. C. Lee, Ganesh Subbaryan, and Paul G. Wilkin for Electromagnetic Bounce Back Braking for Punch Press and Punch Press Process.

U.S. patent application Ser. No. 08/098,485, filed Jul. 27, 1993, by Thomas Gall, Howard Heck, and John Kresge for Parallel Processor and Method of Fabrication.

U.S. patent application Ser. No. 08/097,520, filed Jul. 27, 1993, by Thomas Gall and James Loomis for Parallel Processor Structure and Package.

U.S. patent application Ser. No. 08/097,605, filed Jul. 27, 1993, by Chi-Shi Chang and John P. Koons for Parallel Processor Bus Structure and Package Incorporating The Bus Structure.

U.S. patent application Ser. No. 08/097,601, filed Jul. 27, 1993, by John Andrejack, Natalie Feilchenfeld, David B. Stone, Paul Wilkin, and Michael Wozniak for Flexible Strip Structure for a Parallel Processor and Method of Fabricating The Flexible Strip.

U.S. patent application Ser. No. 08/097,604, filed Jul. 27, 1993, by Donald Lazzarini and Harold Kohn for Method of Fabricating A Parallel Processor Package.

FIELD OF THE INVENTION

The invention relates to the fabrication of packaging structures for parallel processors. More particularly the parallel processor packages fabricated by the method of the invention have a plurality of printed circuit cards and/or boards, e.g., dedicated printed circuit cards and/or boards, for carrying processors, memory, and processor/memory elements. The printed circuit cards and/or boards are mounted on and interconnected through a plurality of circuitized flexible cable substrates, i.e., flex strips. The circuitized flexible cable substrates, i.e., flex strips, connect the separate printed circuit boards and cards through a central laminate portion. This central laminate portion provides Z-axis, layer to layer means for inter-processor, inter-memory, interprocessor/memory element, and processor to memory bussing interconnection, and communication through vias and through holes extending from flex strip to flex strip through the laminate.

BACKGROUND OF THE INVENTION

Parallel processors have a plurality of individual processors, all capable of cooperating on the same program. Parallel processors can be divided into Multiple Instruction Multiple Data (MIMD) and Single Instruction Multiple Data (SIMD) designs.

Multiple Instruction Multiple Data (MIMD) parallel processors have individual processing nodes characterized by fast microprocessors supported by many memory chips and a memory hierarchy. High performance inter node communications coprocessor chips provide the communications links to other microprocessors. Each processor node runs an operating system kernel, with communications at the application level being through a standardized library of message passing functions. In the MIMD parallel processor both shared and distributed memory models are supported.

Single Instruction Multiple Data (SIMD) parallel processors have a plurality of individual processor elements under the control of a single control unit and connected by an intercommunication unit. SIMD machines have an architecture that is specified by:

1. The number of processing elements in the machine.
2. The number of instructions that can be directly executed by the control unit. This includes both scalar instructions and program flow instructions.
3. The number of instructions broadcast by the control unit to all of the processor elements for parallel execution. This includes arithmetic, logic, data routing, masking, and local operations executed by each active processor element over data within the processor element.
4. The number of masking schemes, where each mask partitions the set of processor elements into enabled and disabled subsets.
5. The number of data routing functions, which specify the patterns to be set up in the interconnection network for inter-processor element communications.

SIMD processors have a large number of specialized support chips to support dozens to hundreds of fixed point data flows. Instructions come from outside the individual node, and distributed memory is supported.

Parallel processors require a complex and sophisticated intercommunication network for processor-processor and processor-memory communications. The topology of the interconnection network can be either static or dynamic. Static networks are formed of point-to-point direct connections which will not change during program execution. Dynamic networks are implemented with switched channels which can dynamically reconfigure to match the communications requirements of the programs running on the parallel processor.

Dynamic networks are particularly preferred for multi-purpose and general purpose applications, Dynamic networks can implement communications patterns based on a program demands. Dynamic networking is provided by one or more of bus systems, multistage intercommunications networks, and crossbar switch networks.

Critical to all parallel processors, and especially to dynamic networks is the packaging of the interconnection circuitry. Specifically, the interconnection must provide high speed switching, with low signal attenuation, low crosstalk, and low noise.

SUMMARY OF THE INVENTION

The invention relates to fabrication tools and a fabrication method for parallel processor packages and structures. The parallel processors fabricated by the tool and apparatus of the invention have a plurality of printed circuit cards and/or boards, e.g., dedicated printed circuit cards and/or boards, for carrying processors, memory, and processor/memory elements. The printed circuit cards and/or boards are mounted on a plurality of circuitized flexible substrates, i.e., flex strips. The circuitized flexible substrates connect the separate printed circuit boards and cards through a relatively rigid central laminate portion. This central laminate portion provides means, e.g. Z-axis means, for inter-processor, inter-memory, interprocessor/memory element, and processor to memory bussing interconnection, and communication.

Parallel processor systems have a plurality of individual processors, e.g., microprocessors, and a plurality of memory modules. The processors and the memory can be arrayed in one of several interconnection topologies, e.g., an SIMD (single instruction/multiple data) or an MIMD (multiple instruction/multiple data).

The memory modules and the microprocessors communicate through various topologies, such as hypercubes and toroidal networks, solely by way of exemplification and not limitation, among others. These inter-element communication topologies have various physical realizations. According to the invention described herein, the individual logic and memory elements are on printed circuit boards and cards. These printed circuit boards and cards are, in turn, mounted on or otherwise connected to circuitized flexible substrates extending outwardly from a relatively rigid, circuitized laminate of the individual circuitized flexible substrates. The intercommunication is provided through a switch structure that is implemented in the laminate. This switch structure, which connects each microprocessor to each and every other microprocessor in the parallel processor, and to each memory module in the parallel processor, has the physical structure shown in FIG. 1 and the logical/electrical structure shown in FIG. 2.

Figure 1:
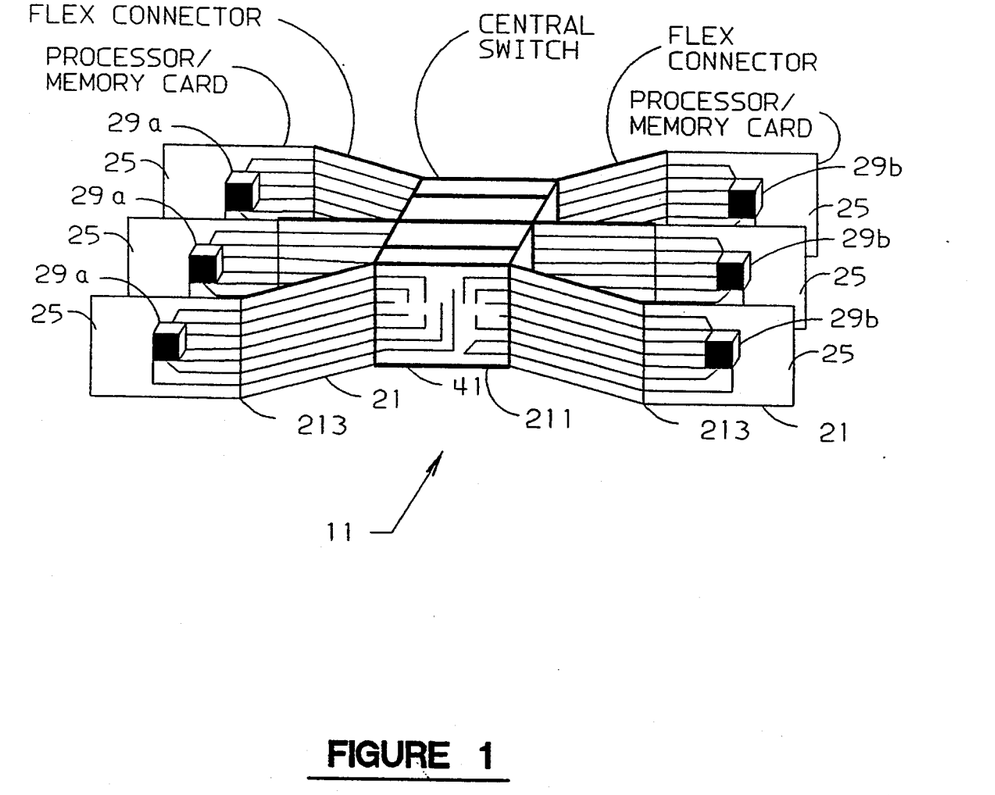
FIG. 1 shows an overview of the mechanical and structural features of the parallel processor package of the invention.
Figure 2:
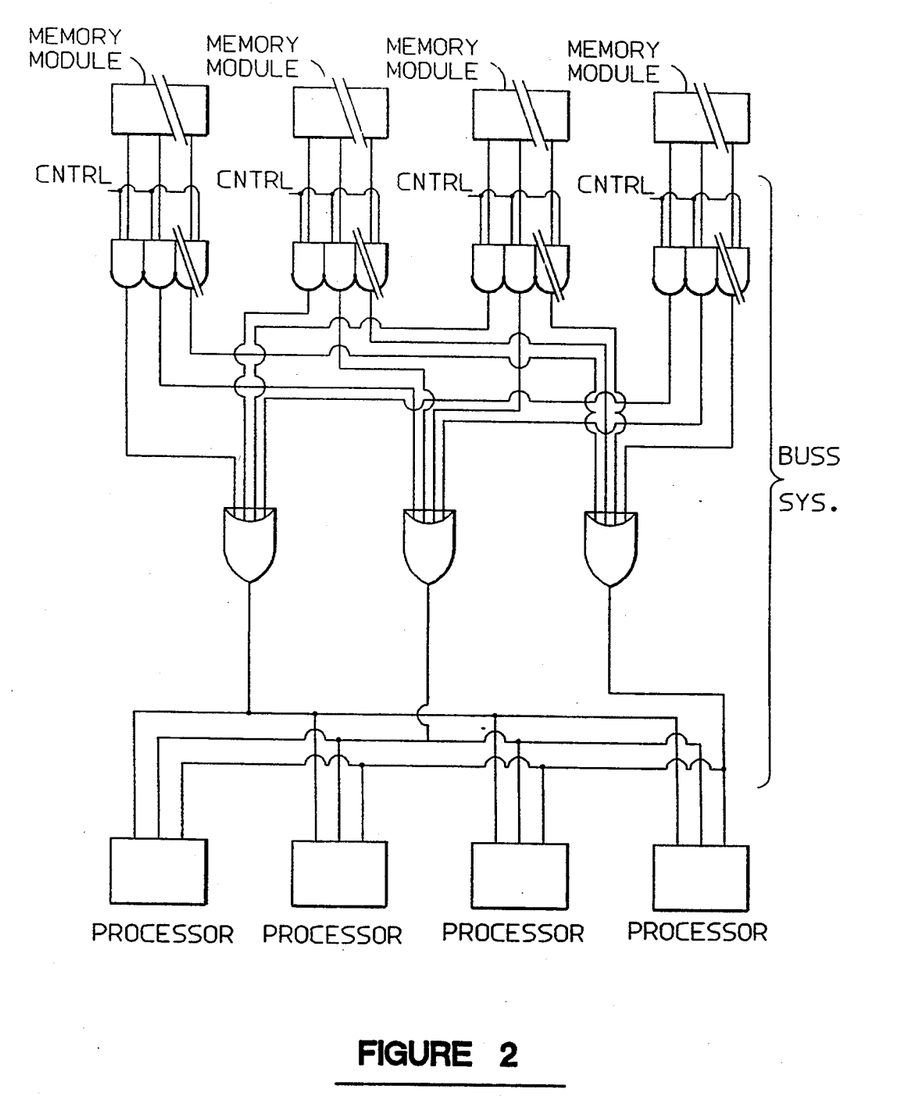
FIG. 2 shows a generalized and simplified schematic of one bus of bus structures that can be implemented in the package of the invention.

More particularly, the preferred physical embodiment of this electrical and logical structure is a multi-layer switch structure shown in FIG. 1. This switch structure provides separate layers of flex 21 for each unit or pairs of units, that is, each microprocessor, each memory module, or each microprocessor/memory element. The planar circuitization, as data lines, address lines, and control lines are on the individual printed circuit boards and cards 25, which are connected through the circuitized flex 21, and communicate with other layers of flex through Z-axis circuitization (vias and through holes) in the central laminate portion 21 in FIG. 1. The bus structure is illustrated in FIG. 2, which shows a single bus, e.g., a data bus as the A bus, the B Bus, or the O Bus, connecting a plurality of memory units through a bus, represented by OR-gates, to four processors. The Address Bus, Address Decoding Logic, and Read/Write Logic are not shown. The portion of the parallel processor represented by the OR gates, the inputs to the OR gates, and the outputs from the OR gates is carried by the laminated flex structure 41.

Structurally the parallel processor 11 has a plurality of integrated circuit chips 29, as processor chips 29a mounted on a plurality of printed circuit boards and cards 25. For example, the parallel processor structure 11 of our invention includes a first processor integrated circuit printed circuit board 25 having a first processor integrated circuit chip 29a mounted thereon and a second processor integrated circuit printed circuit board 25 having a second processor integrated circuit chip 29a mounted thereon.

Analogous structures exist for the memory integrated circuit chips 29b, the parallel processor 11 having a plurality of memory chips 29b mounted on a plurality of printed circuit boards and cards 25. In a structure that is similar to that for the processor chips, the parallel processor 11 of our invention includes a first memory integrated circuit printed circuit board 25 having a first memory integrated circuit chip 29b mounted thereon, and a second memory integrated circuit printed circuit board 25 having a second memory integrated circuit chip 29b mounted thereon.

Mechanical and electrical interconnection is provided between the integrated circuit chips 29 mounted on different printed circuit boards or cards 25 by a plurality of circuitized flexible strips 21. These circuitized flexible strips 21 each have a signal interconnection circuitization portion 211, a terminal portion 213 adapted for carrying a printed circuit board or card 25, and a flexible, circuitized portion between the signal interconnection circuitization portion 211 and the terminal portion 213. The signal interconnection circuitization portion 211, has X-Y planar circuitization 214 and vias and through holes 215 for Z-axis circuitization.

The flexible circuitized strips 21 are laminated at their signal interconnection circuitization portion 211. This interconnection portion is built up as lamination of the individual circuitized flexible strips 21, and has X-axis, Y-axis, and Z-axis signal interconnection between the processor integrated circuit chips 29a and the memory integrated circuit chips 29b. In the resulting structure the circuitized flexible strips 21 are laminated in physical and electrical connection at their signal interconnection circuitization portions 211 and spaced apart at their terminal portions 213.

The individual circuitized flexible strips 21 are discrete subassemblies. These subassemblies are themselves a laminate of at least one internal power core, at least one signal core 222, with a layer of dielectric 223 therebetween. The dielectric 223 is a polymeric dielectric having a dielectric constant less than 3.5, as a polyimide or a perfluorocarbon polymer, or, in a preferred exemplification, a multi-phase composite of a polymeric dielectric material having a low dielectric constant and having a low dielectric constant, low coefficient of thermal expansion material dispersed therethrough. Preferably the composite has a dielectric constant less than 3.5, and preferably below about 3.0, and in a particularly preferred embodiment below about 2.0. This is achieved by the use of a low dielectric constant perfluorocarbon polymer matrix, filled with a low dielectric constant and low coefficient of thermal expansion filler. The perfluorocarbon polymer is chosen from the group consisting of perfluoroethylene, perfluoroalkoxies, and copolymers thereof. The dispersed low dielectric constant material is a low dielectric constant, low coefficient of thermal expansion, particulate filler. Exemplary low dielectric constant particulate filler are chosen from the group consisting of silica particles, silica spheres, hollow silica spheres, aluminum oxide, aluminum nitride, zirconium oxide, titanium oxide, and the like.

The power core may be a copper foil, a molybdenum foil, or a "CIC" (Copper-Invar-Copper) laminate foil. The circuitized flexible strip 21 may be a 1S1P (one signal plane, one power plane) circuitized flexible strip, a 2S1P (two signal planes, one power plane) circuitized flexible strip or a 2S3P (two signal planes, three power planes) circuitized flexible strip.

The circuitized flexible strip 21 can have either two terminal portions 213 for carrying printed circuit boards 25 at opposite ends thereof, or a single terminal portion 213 for carrying a printed circuit board 25 at only one end of the circuitized flexible cable 21. Where the circuitized flexible strip 21 is adapted to carry a printed circuit board 25 at only one end, a pair of circuitized flexible strips 21, each having a terminal portion 213 at only one end can be laminated so that their signal interconnection circuitization portions 211 overlap but their terminal portions 213 and their flexible, circuitized 212 portions extend outwardly from opposite sides of the signal interconnection circuitization laminated body portion 41 of the parallel processor package 11.

The connection between the printed circuit boards and cards 25 and the terminal portions 213 of the circuitized flexible strip 21 can be provided by dendritic Pd.

The solder alloy means for pad to pad joining of the circuitized flexible strips 21 at the signal interconnection circuitization portions 211 thereof is an alloy composition having a final melting temperature, when homogenized, above the primary thermal transition temperature of the dielectric material and having a system eutectic temperature below the primary thermal transition temperature of the dielectric. This can be a series of Au and Sn layers having a composition that is gold rich with respect to the system eutectic, said alloy having a system eutectic temperature of about 280 degrees Centigrade, and a homogeneous alloy melting temperature above about 400 degrees Centigrade, and preferably above about 500 degrees Centigrade.

The method disclosed herein includes a method of forming the parallel processor structure by selectively defining and controlling the adhesion between the flex layers 21 within and beyond the laminate structure 41. This can be done by providing a low melting temperature adhesive compatible with the perfluorocarbon polymer between the subassemblies 21 in the regions intended to be laminated 211, and stacking a first subassembly 21 above a second subassembly 21 and heating the subassembly stack to effect adhesion and lamination.

In this embodiment low melting temperature adhesive compatible with the perfluorocarbon polymer is preferably another perfluorocarbon, for example, a perfluoroalkoxy (PFA) polymer having a lower primary thermal transition temperature then the bulk perfluorocarbon. Additional adhesives include thermoplastic polyimide, such as those chosen from the group consisting of Pyralin 2525 benzophenone tetracarboxylic acid dianhydride-oxydianiline-meta-phenylene diamine BTDA-ODA-MPD, (BTDA-ODA-MPD), biphenyl tetracarboxylic acid dianhydride-4,4'-hexafluoro isopropylidene diphthalic acid diamine (BPDA-6FDAM), and Pyralin 2566 4,4'-hexafluoro isopropylidene diphthalic acid dianhydride-oxydianiline 6FDA-ODA).

A high melting temperature polymer, e.g, a perfluorocarbon polymer or a polyimide mask, that when fully cured is chemically incompatible (substantially chemically non reactive and non adhesive) with the bulk polymer can be placed between the subassemblies 21 in the regions not intended to be laminated 212, 213. This is followed by stacking a first subassembly 21 above a second subassembly 21 and heating the subassembly stack to selectively effect adhesion and lamination in the areas intended to be laminated 211 while avoiding lamination in areas not intended to be laminated 213.

The preferred polymeric mask can be a polyimide, such as biphenyl tetracarboxylic acid dianhydride-phenylene diamine (BPDA-PDA). The polyimide is processed as a polyamic acid, which can be drawn down onto surfaces of the dielectric not intended to be laminated, and cured to the corresponding polyimide, or alternatively, the biphenyl tetracarboxylic acid dianhydride-phenylene diamine (BPDA-PDA) can be applied as a free standing film through lamination to the polymeric dielectric 21. Lamination can be above the melting temperature of the dielectric but below the imidization temperature of the polyamic acid, followed by cure to the corresponding polyimide.

Lamination is carried out with a low melting adhesive that is chemically compatible (i.e., bondable) with the perfluorocarbon polymer between the subassemblies in the regions intended to be laminated, and a high melting mask that is not chemically compatible (i.e., not bondable) with the perfluorocarbon polymer between the subassemblies in the regions not intended to be laminated.

According to a further method of the invention it is possible to join a first circuitized polymeric panel 21 to a second circuitized polymeric panel 21, where each of the circuitized polymeric panels 21 has at least a pair of facing, electrically conductive pads 216 for panel to panel electrical connection. In this method of the invention metals are deposited 217 onto the facing pads 216 for metallurgical bonding. The metals selected are those that are capable of forming a eutectic. The metals are deposited in a non-eutectic stoichiometry. The assembly is than heated while a compressive force is applied to the circuitized polymeric panels 21 to bond the panels 21. The panels 21 are heated above the melting temperature of the polymeric dielectric or of the adhesive, if any. The eutectic temperature of the eutectic forming system is below the melting temperature of the dielectric polymer used in bonding. However, the actual stoichiometry of the deposit is non-eutectic, and the melting point of the homogenized metallic composition is above the melting point of the dielectric polymer used in bonding. In a preferred embodiment of this exemplification of the invention the eutectic forming system is Au-Sn, the melting temperature of the dielectric polymer is above the eutectic temperature of the Au-Sn system, and below the melting temperature of the homogenized Au-Sn alloy formed. In a further embodiment a thin film or flash plate of Au can be applied above the Sn to keep the Sn from oxidizing during processing or storage.

According to a further embodiment of the invention there is provided a laminate 41 of circuitized polymeric dielectric panels 21 with pad 216 to pad 216 electrical connection between the circuitized flexible panels 21. This pad 216 to pad 216 electrical connection is provided by a transient liquid phase formed bond of a joining metallurgy characterized by a non-eutectic stoichiometry composition of a eutectic forming system. The eutectic temperature of the system is below the melting temperature of the polymeric dielectric, and the final melting temperature of the homogenized joining metallurgy composition is above the melting temperature of the polymeric dielectric. In a preferred embodiment of this exemplification the joining metallurgy is an Au rich Au-Sn alloy. Preferably the Au-Sn alloy has an atomic ratio of Au/[Au+Sn] of at least about 0.6, and preferably about 0.8 to 0.9.

THE FIGURES

The invention may be understood by reference to the Figures appended hereto.

DETAILED DESCRIPTION OF THE INVENTION

The invention described herein relates to a parallel processor 1 and a parallel processor package 11 having a plurality of integrated circuit chips 29, e.g., microprocessors 29a, preferably advanced microprocessors, and memory modules 29b, mounted on printed circuit cards and boards 25, and connected through a laminate 41 of circuitized flexible strips 21 as will be described herein below. The structure and methods of fabricating the structure and similar structures are useful in parallel processors, in bank switched memory with memory banks or fractional memory banks on an individual flex connector, and for providing flex cable to flex cable connection in a heavily interconnected network.

Advanced microprocessors, such as pipelined microprocessors and RISC (reduced instruction set computer) microprocessors provide dramatic increases in chip level integration and chip level circuit densities. These advanced microprocessors, in turn, place increasing demands on wiring densities and interconnections at the next lower levels of packaging. Moreover, when advanced microprocessors are combined into multi-processor configurations, i.e., parallel processors, as SIMD and MIMD parallel processors, still higher levels of performance, circuit density, including logic density and memory density, and I/O packaging, are all required.

The basic parallel processor structure 11 of the invention, e.g., an SIMD or an MIMD parallel processor, builds from a plurality of microprocessors 29a and a plurality of memory modules 29b, with the memory modules 29b and the microprocessors 29a communicating through a laminate switch structure 11. This switch, which connects each microprocessor 29a to each and every other microprocessor 29a in the parallel processor 1, and to each memory module 29b in the parallel processor 1, has the logical/electrical structure shown in FIG. 2.

Laminate Switch Structure

Figure 4:
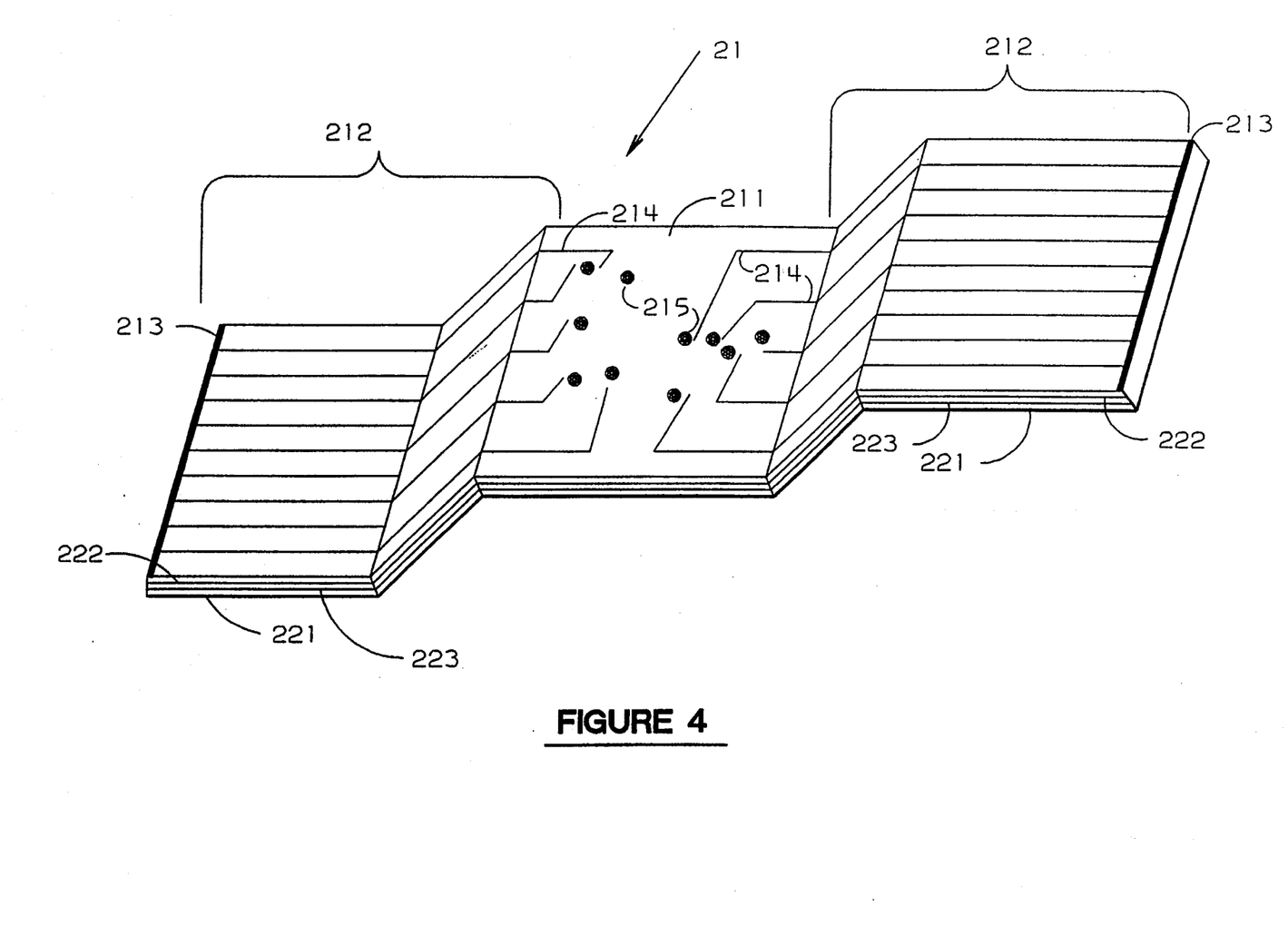
FIG. 4 shows a perspective view of a circuitized flexible strip of the invention having surface circuitization, Pd dendrites for connecting the printed circuit boards or cards thereto, and joining metallurgy, vias, and through holes on the portion intended to be laminated.

The parallel processor package 11 of the invention integrates carrier, connector, and I/O into a single package, with multiple circuitized flexible cables 21 that are built into a carrier cross section 41 using discrete subassemblies 21 which are laminated together to form a Z-axis signal and power connection laminate 41 between the discrete subassemblies 21. A discrete subassembly is shown generally in FIG. 4.

The physical embodiment of the package 11 yields high performance by utilizing high wirability printed circuit board technology that enhances present printed circuit card and board technology for massively parallel processor systems, while providing cost and performances advantages. Both the laminate 41, which we refer to as a central, switch, or rigid portion, and the outwardly extending flex portions 21 (intended for attachment to printed circuit boards or cards 25 carrying the memory modules 29b and the logic modules 29a) are characterized by printed circuit board like cross sections, and a low dielectric constant polymer substrate.

The physical embodiment of this electrical and logical structure encompasses the multilayer laminate switch structure shown in FIG. 1. This switch structure provides a separate layer of flex 21 for each printed circuit board or card 25 or each pair thereof. Each individual printed circuit board or card 25 can carry a microprocessor 29a, a memory module 29b, I/O, or a microprocessor/memory element. The planar circuitization 214, as data lines, address lines, and control lines is on the flex 21, and communicates with other layers of flex 21 through vias and through holes 217 in the laminate central portion 41, shown in FIG. 4.

This laminate flex design provides a large number of I/O's, for example twenty five thousand or more, from the package 11 while eliminating the need for the manufacture, alignment, and bonding of discrete flex cables extending outwardly from a single panel. A conventional planar panel would have to be many times larger to have room for the same connectivity as the integrated flex/rigid/flex or rigid/flex of the invention.

Flex Card Carriers Joined At A Central Laminate Switch Portion

The package 1 of the invention combines a laminate central or switch portion 41 and circuitized flexible strip extensions 21 extending outwardly therefrom and carrying terminal printed circuit boards and cards 25 for circuit elements 29a and 29b, such as integrated circuit chips 29, thereon.

Heretofore flex cables and flex carriers have been integrated onto one or two surfaces, i.e., the top surface or the top and bottom surfaces, of a carrier. However, according to the present invention the flex cables 21 are integrated into a central switch or carrier structure 41 as a laminate with a plurality of stacked, circuitized flex strips 21. The area selective lamination of the flex carriers 21 in the central region 211 forms the rigid laminate carrier 41. This laminate region 41 carries the Z-axis circuitization lines from flex 21 to flex 21.

The individual plies of flex 21 have internal conductors, i.e., internal power planes 221 and internal signal planes 222. Additionally, in order to accommodate the narrow dimensional tolerances associated with the high I/O density, high wiring density, and high circuit density, it is necessary to carefully control the Coefficient of Thermal Expansion (CTE) of the individual subassemblies. This is accomplished through the use of an internal metallic conductor 221 of matched coefficient of thermal expansion (CTE), such a molybdenum foil or a Cu/Invar/Cu foil, to which the layers of dielectric 223 are laminated.

The combination of circuitized flex 21 extending outwardly from a central laminate section 41, with vias 215 and through holes 215 electrically connecting separate plies 21 of circuitized flex therethrough, reduces the footprint associated with the chip carrier, as wiring escape is easier.

This structure offers many advantages for a parallel processor, especially a massively parallel processor, as well as any other heavily interconnected system. Among other advantages, a reduced size chip carrier is possible, as escape is made easier, signal transmission lengths are reduced, and discontinuities due to contact mating between chip carrier and flex are reduced and reliability is enhanced as the chip carrier and the flex are a single entity.

The design of the parallel processor package calls for all vertical (Z-axis) connections to be made by bonding a joining alloy, e.g., transient liquid phase bonding Au/Sn, and the organic dielectric, as a perfluoropolymer, into a laminate of circuit panels, while the outwardly extending edges 212 and 213 of the panels 21 are not bonded, so that they can act as circuitized flex cables. This flexibility or bendability allows the printed circuit boards and cards 25 to be offset from one another remote from the laminate 41.

Specialized Cards and Boards

The parallel processor package described herein and fabricated by the tool and method of our invention allows a variety of component types to be mounted on the flexible elements. Specifically, the printed circuit card and board terminated circuitized flex strips are analogous to printed circuit boards and cards mounted in expansion slots in a conventional planar motherboard. The cards and boards at the ends of the circuitized flex strips can include Tape Automated Bonding (TAB) components, e.g., high I/O, fine lead pitch TAB.

Alternatively, surface mount circuitization can be utilized, for example, fine pitch plastic and ceramic surface mount packages.

Alternatively, high I/O area array solder ball connection techniques may be used. One such high I/O area array solder ball connected chip is shown mounted on a card that is, in turn, mounted on a flexible cable in FIG. 5.

According to still further embodiment of the invention chip on board bonding and interconnection may be used.

Detailed Structural Design and Fabrication

The central switch portion, i.e., the laminate portion, and the flex strips, used as card carriers in a manner analogous to expansion slots, are a single structural entity. This is achieved by selectively defining and controlling the adhesion between the layers of the structure. The layers can be either (1) discrete 2S3P (2 signal plane, 3 power plane) structures, substantially as shown in FIG. 6, or (2) combinations of discrete 2S3P (2 Signal plane, 3 power plane) and 2S1P (2 signal plane, 1 power plane) structures.

Figure 3:
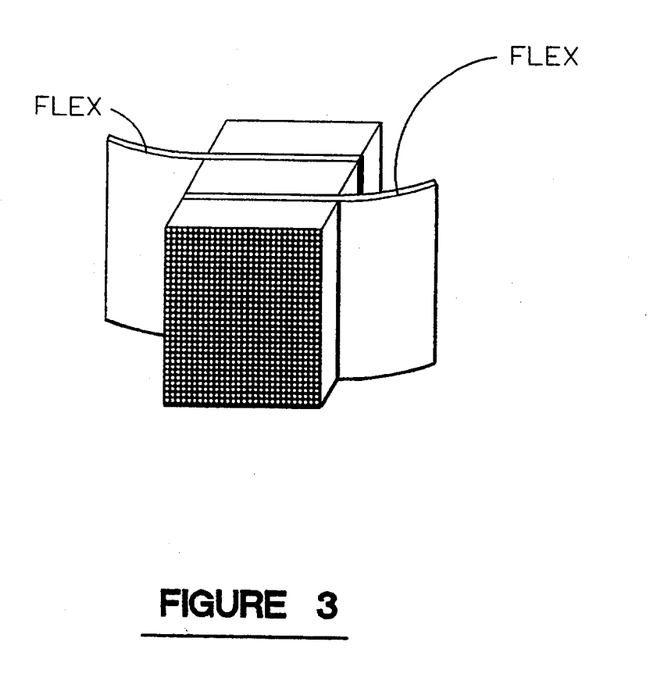
FIG. 3 shows the lamination of circuitized flexible strips to form a laminate with free portions.

The areas of the panel treated to achieve adhesion are laminated together to form the laminate 41, as shown in FIG. 3. Regions where there is no adhesion remain as flexible strips 21. Cards, either removable or soldered, for carrying microprocessor chips and/or memory chips, are carried by these outward extending segments of flex.

According to one method of the invention, a low coefficient of thermal expansion (CTE) tri-metallic foil as Copper/Invar/Copper (CIC) 221 is laminated between perfluorocarbon polymer sheets 222. The resulting laminate is than circuitized 223 to form a circuitized flex strip 21. More specifically, a solid, 1 mil, Cr sputtered, Cu/Invar/Cu panel, 14.5×10.0 inches, is sandwiched between 2 sheets of Rogers 2800 PFA dielectric sheet material or similar dielectric sheet material. Lamination is carried out at a high temperature, e.g., about 390 degrees C, and a high pressure, e.g., 1700 psi, for 30 minutes, in a non-reactive atmosphere, e.g., $N_2$. Metal layers, foils, and films may be laminated to the substrate to manage electromagnetic fields and provide electromagnetic shielding between layers. Additional dielectric sheets may be laminated to one or both sides of the structure, for example, after circuitization.

Subsequently, the subassemblies are laminated together, generally at a lower pressure, and at a lower temperature which is above the adhesive melting temperature and below the perfluorocarbon polymer melting temperature, but otherwise substantially under the conditions described above. This is because core lamination, carried out at relatively high pressures, for example, above about 300 psi, densifies the dielectric, while laminations carried out at below about 300 psi do not densify the dielectric. The multilayer lamination is defined so that controlled and selective adhesion is achieved. This can be accomplished preferably by selection of adhesives, and alternatively by masking. That is, those portions that are not to be laminated together, i.e., that are to remain as outwardly extending flex, are either masked or coated with a high melting temperature polymer to selectively control adhesion.

2S3P Flex Panel Components

The circuitized flex strips can be 2S1P (two signal planes, one power plane) or 2S3P (two signal planes, three power planes) structures. The 2S3P design of the circuit cores, including the flexes, has 2 planes of signal wiring, a CIC core which can be a ground plane, and 2 shield planes that can act as power planes. To be especially noted is that in this embodiment of the invention the signal planes are not at the center of the core, so that the copper lines on the flex portions are in compression on the inside bend radius and in tension on the outside bend radius. Having the copper signal lines non-coincident with the center of curvature can increase the probability of flex failure.

However, according to this embodiment of the invention a double 1S1P panel is utilized. The structure, shown in FIG. 6 has a flex cable formed of a layer of a low CTE metal, as Cu, Mo or a Cu/Invar/Cu laminate, bonded to a layer of a low dielectric constant material, as PTFE, PFA, or a perfluoroalkyl/silica composite. A metallization layer is present atop the fluorocarbon dielectric. The metallization layer surfaces are patterned, with circuitization on one side of the flex, and joining pads on the opposite side of the flex. The joining areas of the panel will be bonded together with the copper signal wires covered with a layer of dielectric before bonding. The portions of the panels intended to be bonded to form the laminate have vias and through holes drilled in them. Metal deposited in the drilled vias and through holes, to provide electrical contact between non-coplanar signal wires.

The circuitized subassemblies are than stacked, with flex cable portions extending outwardly from the central portion, as shown in FIG. 3. The center portion is than compressed to bond the layers. Bonding may be by organic adhesion of the dielectric and/or by transient liquid phase metal bonding of the conductor pads and lands.

Alternative Flex Geometry

In a preferred embodiment of the invention, the laminate portion 41 of the parallel processor package has all of its vertical (Z-axis) connections made by bonding a joining alloy, e.g., by transient liquid phase bonding Au/Sn, and adhesive bonding the organic dielectric, as a PFA, to form the laminate portion of the stack of circuitized flex panels, while the edges of the panels, used for carrying printed circuit boards and cards, are not bonded, so that they can act as flex cables.

The challenge faced in design and fabrication of the integrated panel is to build the integrated flex panel with sufficiently long flex cables to allow the required vertical (Z-axis) connectivity in the laminated portion, and still provide the required chip population and escape beyond the laminated region.

According to one embodiment of the invention the package is fabricated with sequential flex cables extending outwardly from opposite sides of the laminate portion of the package. That is, the flex cables can overlap in the lamination portion of the package, but alternating flex cables extend outwardly from opposite sides of the central portion of package, substantially as shown in FIG. 3. The subassemblies can be assembled so that a first pair of flex cables extend outwardly from one side of the package, and than the next pair of flex portions extend outwardly from the opposite side of the central portion as shown in FIG. 3.

Alternatively, the subassemblies can be assembled so that a first flex cable extends outwardly from one side of the package, and than the next flex portion extends outwardly from the opposite side of the central portion.

Fabrication Tool

Figure 5:
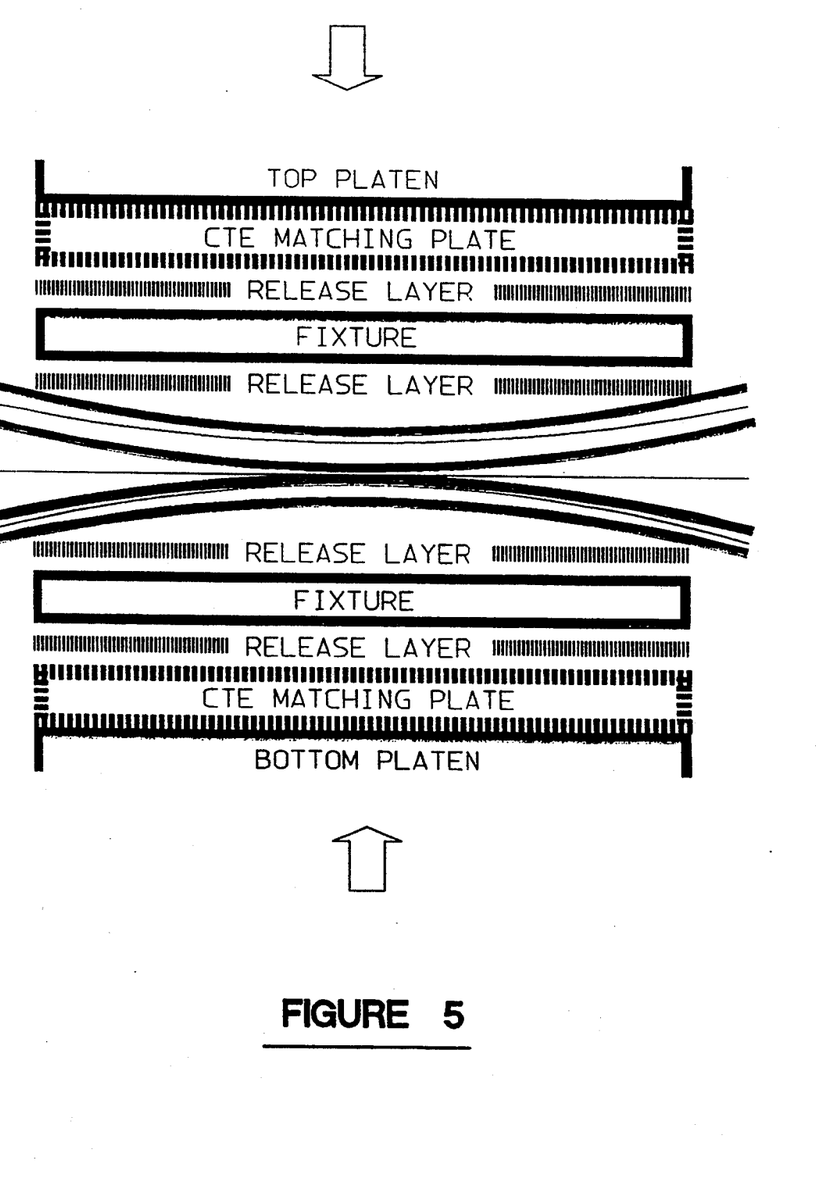
FIG. 5 shows a lamination tool of a method of the invention.

The lamination fixture 301 of our invention, shown with specificity in FIG. 5, fits into and between a pair of platen plates 303a, 303b.

The lamination fixture 301 includes one or two plates 305a, 305b, having a Coefficient of Thermal Expansion (CTE) matching that of the power planes of the individual subassemblies 211. In the case of subassemblies 211 having a Cu/Invar/Cu laminate power plane, the CTE matching plates are Cu/Invar/Cu plates 305a, 305b. When, however the power planes are Cu power planes, the CTE matching plates 305a, 305b are Cu plates, and when the power planes are Mo planes, the CTE matching plates 305a, 305b, are Mo plates. There may be one CTE matching plate 305a or 305b at the top or bottom of the stack, or a pair of CTE matching plates 305a, 305b, on the top and bottom of the stack.

Release layers 307a, 307b, are provided between the CTE matching plates 305a, 305b, and the fixture 309. A further set of release layers 311a, 311b, are provided between the fixture 309, and the stack of subassemblies 211.

The fixture provides center joining without damaging the flex cables extending outwardly therefrom.

To be noted is that adhesive sheets are provided between parts of the subassemblies 211 to be bonded, and chemically incompatible sheets (i.e., sheets of a material that does not bond with the perfluorocarbon sheets of the subassemblies 211) are between portions not intended to be bonded.

While not shown, it is, of course, to be understood that stiffener sheets may be present on the top or the bottom or both of the central laminate portion.

Lamination Process

In the first step, a conductive material, as Cu, a dielectric, as PTFE or PFA, and a second conductive material, as a Copper foil, a Copper/Invar/Copper foil, or a Molybdenum foil, are laminated together to form a blank core. Photoresist is than applied to both sides of the blank core. Both surfaces of the blank core are than photolithographically imaged. Photolithographic imaging includes imaging of the alignment fiducials. Specifically, alignment fiducials are etched into the power core with reference to the clearance holes and in alignment to features in the signal layer. The core blank is than etched. After etching the resist covering is removed from both sides.

In the next processing step the core is relaminated, and the core is than enclosed with dielectric and a cover or release sheet of, e.g., Cu. The cover sheet is etched and the dielectric covering the power core alignment fiducials is removed. The fiducials are than used to align the core to a punch or drill, and form the power and signal vias.

Power plane connections are made. The core is next treated with a seed layer and a flash plate, and photolithographically imaged. This brings the buried signal circuitry to the top surface of the structure so that interlevel connections can be made.

A 2S2P or a triplate can be formed from the above structure by either of two methods. In the first method the signal side image is different from the power side. This allows a plating coat to cover the surface and form a ground plane or isolation barrier that encloses the signal circuitry with ground or power planes that are equidistant from the signal plane.

Alternatively, a half thickness of dielectric can be applied atop the circuit layer of the 1S1P structure, and another one half thickness can be placed over the power layer of its mating 1S1P structure. In this way, upon lamination the original power planes enclose the signal layer, and are equidistant from the signal layer.

The subassemblies are than assembled. This results in a true triplate structure.

The parallel processor package 11 is fabricated by interleaving individual layers 21 or subassemblies 21 such that the central laminate joining areas 211 of the panels provide layer to layer interconnections while the right or left sides of the panel, i.e., the portions intended to remain as flex, 212, 213, extend outwardly from the laminate region 41. Moreover, the fabrication method of the invention allows card and board joining metallurgy to applied to the outwardly extending flex portions, while assembly to assembly joining metallurgy is applied to the central portions of the subassemblies.

One of the problems in laminating the subassemblies to form the laminate region is wrinkling and damaging of the portions of the subassemblies that are not to be laminated, i.e., the flex.

According to our invention a lamination fixture is provided. The fixture, shown in FIG. 5 fits into a parallel platen press 301. The platen press 301 puts pressure primarily onto the portion of the subassemblies 211 to be laminated. Separator sheets are placed between adjacent subassemblies in regions not to be laminated 212 and 213. The separator sheets are high temperature materials, with a coefficient of thermal expansion comparable to that of the materials used in forming the dielectric, as Upilex-S polyimide.

The lamination fixture 301 of our invention, shown with specificity in FIG. 5, fits into and between a pair of platen plates 303*a*, 303*b*.

The lamination fixture 301 includes one or two plates 305*a*, 305*b*, having a Coefficient of Thermal Expansion (CTE) matching that of the power planes of the individual subassemblies 211. In the case of subassemblies 211 having a Cu/Invar/Cu laminate power plane, the CTE matching plates are Cu/Invar/Cu plates 305*a*, 305*b*. When, however the power planes are Cu power planes, the CTE matching plates 305*a*, 305*b* are Cu plates, and when the power planes are Mo planes, the CTE matching plates 305*a*, 305*b*, are Mo plates. There may be one CTE matching plate 305*a* or 305*b* at the top or bottom of the stack, or a pair of CTE matching plates 305*a*, 305*b*, on the top and bottom of the stack.

Release layers 307*a*, 307*b*, are provided between the CTE matching plates 305*a*, 305*b*, and the fixture 309. A further set of release layers 311*a*, 311*b*, are provided between the fixture 309, and the stack of subassemblies 211.

The fixture provides center joining without damaging the flex cables extending outwardly therefrom.

To be noted is that adhesive sheets are provided between parts of the subassemblies 211 to be bonded, and chemically incompatible sheets (i.e., sheets of a material that does not bond with the perfluorocarbon sheets of the subassemblies 211) are between portions not intended to be bonded.

While not shown, it is, of course, to be understood that stiffener sheets may be present on the top or the bottom or both of the central laminate portion.

While the invention has been described with respect to certain preferred embodiments and exemplifications, it is not intended to limit the scope of the invention, but solely by the claims appended hereto.

We claim:

1. A method of fabricating a parallel processor laminate structure having a plurality of processor integrated circuit chips, and a plurality of memory integrated circuit chips, with signal interconnection circuitization means therebetween, wherein a. the processor integrated circuit chips and the memory integrated circuited chips are mounted on a plurality of printed circuit cards and boards with a first processor integrated circuit printed circuit board having a first processor integrated circuit chip mounted thereon, a second processor integrated circuit printed circuit board having a second processor integrated circuit chip mounted thereon, a first memory integrated circuit printed circuit board having a first memory integrated circuit chip mounted thereon, and a second memory integrated circuit printed circuit board having a second memory integrated circuit chip mounted thereon;

b. said printed circuit cards and boards are mounted on a plurality of perfluorocarbon polymer circuitized flexible layers, said circuitized perfluorocarbon polymer flexible layers having a signal interconnection circuitization portion with X-Y planar circuitization and vias and through holes for Z-axis circuitization, a terminal portion having means for joining a printed circuit board thereto, and a flexible, circuitized portion between said signal interconnection circuitization portion and said terminal portion, and c. said circuitized perfluorocarbon polymer flexible layers are joined at a signal interconnection circuitization body portion having X-axis, Y-axis, and Z-axis signal interconnection between processor integrated circuit chips and memory integrated circuit chips and comprising a laminate of said circuitized flexible layers at their signal interconnection circuitization portions, whereby said circuitized flexible layers are laminated in physical and electrical connection at their signal interconnection circuitization portions and spaced apart at their terminal portions;

said process comprising placing a stack of perfluorocarbon polymer flexible layers to be joined into a lamination fixture, said lamination fixture being between a pair of platens, and separated from said pair of platens by at least one coefficient of thermal expansion matching plate, and by a pair of release layers, said fixture being substantially conformal to the shape of the stack of flexible layers, and being separated from the top and bottom of the stack of flexible layers by release layers, said method further comprising applying a pressure above about 300 psi and a temperature above about 390 degrees Celsius to the stack of flexible layers while selectively defining and controlling the adhesion between the flexible layers within and beyond the laminate structure.

2. The method of claim 1 comprising providing a low melting adhesive compatible with the perfluorocarbon polymer between the layers in the regions intended to be laminated, and thereafter heating the stack of flexible layers to effect adhesion and lamination.

3. The method of claim 2 wherein the low melting adhesive compatible with the perfluorocarbon polymer is a thermoplastic polyimide.

4. The method of claim 3 wherein the thermoplastic polyimide is chosen from the group consisting of benzophenone tetracarboxylic acid dianhydride-oxydianiline-metaphenylenediamine (BTDA-ODA-MPD), biphenyl-3,3',4,4' tetracarboxylic acid dianhydride-4,4'-hexafluoropropylidene diamine (BPDA-6FDAM), and 4,4'-hexafluoroisopropylidene dianhydride-oxydianiline (6FDA-ODA).

5. The method of claim 1 comprising providing a high melting mask compatible with the perfluorocarbon polymer between the perfluorocarbon polymer circuitized flex layers in the regions not intended to be laminated, and thereafter stacking the circuitized perfluorocarbon polymer flex layers and heating the stack to selectively effect adhesion and lamination in areas thereof intended to be laminated while avoiding lamination in areas not intended to be laminated.

6. The method of claim 5 wherein the high melting mask is biphenyl tetracarboxylic acid dianhydride-phenylene diamine (BPDA-PDA) polyamic acid.

7. The method of claim 6 comprising drawing down the biphenyl tetracarboxylic acid dianhydride-phenylene diamine (BPDA-PDA) polyamic acid onto surfaces of the polyimide dielectric not intended to be laminated, and thereafter curing the biphenyl tetracarboxylic acid dianhydride-phenylene diamine (BPDA-PDA) to the corresponding polyimide.

8. The method of claim 6 comprising applying the biphenyl tetracarboxylic acid dianhydride-phenylene diamine (BPDA-PDA) as a free standing film, and laminating the polyimide dielectric above its melting temperature but below its imidization temperature.

9. The method of claim 1 comprising
   a. providing a low melting adhesive compatible with the perfluorocarbon polymer between the circuitized perfluorocarbon polymer flexible layers in the regions intended to be laminated, and thereafter stacking a first subassembly above a second subassembly and heating the subassembly stack to effect adhesion and lamination; and
   b. providing a high melting mask compatible with the perfluorocarbon polymer between the perfluorocarbon polymer circuitized flexible layers in the regions not intended to be laminated, and thereafter heating the stack circuitized flex strips to selectively effect adhesion and lamination in areas thereof intended to be laminated while avoiding lamination in areas not intended to be laminated.

* * * * *